(12) United States Patent
Trivedi et al.

(10) Patent No.: US 8,530,347 B2
(45) Date of Patent: Sep. 10, 2013

(54) ELECTRONIC DEVICE INCLUDING INTERCONNECTS WITH A CAVITY THEREBETWEEN AND A PROCESS OF FORMING THE SAME

(75) Inventors: Vishal P. Trivedi, Chandler, AZ (US); Jay P. John, Chandler, AZ (US)

(73) Assignee: Freescale Semiconductor, Inc., Austin, TN (US)

( * ) Notice: Subject to any disclaimer, the term of this patent is extended or adjusted under 35 U.S.C. 154(b) by 29 days.

(21) Appl. No.: 12/898,001

(22) Filed: Oct. 5, 2010

(65) Prior Publication Data

US 2012/0080804 A1 Apr. 5, 2012

(51) Int. Cl.
*H01L 21/4763* (2006.01)
(52) U.S. Cl.
USPC ............................................ 438/618; 438/637
(58) Field of Classification Search
CPC ... H01L 23/52; H01L 23/522; H01L 23/5226; H01L 23/538
USPC ............... 438/584, 585, 618, 637; 257/774, 257/E21.577, E23.145, E21.575
See application file for complete search history.

(56) References Cited

U.S. PATENT DOCUMENTS

| | | | |
|---|---|---|---|
| 5,759,913 A | 6/1998 | Fulford, Jr. et al. | |
| 6,057,226 A | 5/2000 | Wong | |
| 6,184,121 B1 | 2/2001 | Buchwalter et al. | |
| 6,200,900 B1 | 3/2001 | Kitch | |
| 6,211,561 B1 | 4/2001 | Zhao | |
| 6,297,125 B1 | 10/2001 | Nag et al. | |
| 6,413,852 B1 | 7/2002 | Grill et al. | |
| 7,005,371 B2 | 2/2006 | Chinthakindi et al. | |
| 7,056,822 B1 * | 6/2006 | Zhao | 438/619 |
| 7,078,352 B2 | 7/2006 | Beyer et al. | |
| 2002/0094673 A1 * | 7/2002 | Dubin | 438/626 |
| 2002/0157610 A1 * | 10/2002 | Sekiguchi et al. | 118/723 VE |
| 2003/0042612 A1 | 3/2003 | Leuschner et al. | |
| 2006/0255432 A1 | 11/2006 | Meagley et al. | |
| 2006/0258077 A1 | 11/2006 | Kunnen | |
| 2007/0102821 A1 | 5/2007 | Papa Rao et al. | |
| 2008/0185728 A1 * | 8/2008 | Clevenger et al. | 257/774 |
| 2011/0021036 A1 | 1/2011 | Braecklmann | |

FOREIGN PATENT DOCUMENTS

EP 0834916 A 4/1998

OTHER PUBLICATIONS

Uno S. et al, "Dual Damascene Process for Air-Gap Cu Interconnects Using Conventional CVD Films as Sacrificial Layers", IEEE, 2005, Japan, pp. 174-176, (2005).

(Continued)

*Primary Examiner* — Khiem D Nguyen

(57) ABSTRACT

A process of forming an electronic device can include providing a first interconnect over a substrate having a primary surface, depositing a first insulating layer over the first interconnect, and patterning the first insulating layer to define an opening extending towards the first interconnect. The process can also include depositing a second insulating layer over the first insulating layer to seal the opening and form a cavity within the first opening, and forming a second interconnect over the first and second insulating layers. The cavity can be disposed between the first interconnect and the second interconnect. In another aspect, an electronic device can include a first interconnect, a first insulating layer defining a cavity, and a second interconnect. The cavity can be disposed between the first interconnect and the second interconnect, and a via may not be exposed within the cavity.

17 Claims, 8 Drawing Sheets

(56) References Cited

OTHER PUBLICATIONS

International Technology Roadmap for Semiconductors (ITRS), Interconnect Chapter, 2007, website: http://www.itrs.net/links/2007itrs/home2007.htm, 67 pages, (2007).
R. Gras et al., "300mm Multi Level Air Gap Integration for Edge Interconnect Technologies and Specific High Performance Applications", 2008 Interconnect Technology Conference, Jun. 2008, Burlingame, CA, USA, pp. 196-198, IEEE ISBN 978-1-4244-1911-1.
Young Chul Lee, "Novel Low-Toss LTCC Microstrip Lines with Air-Cavities Embedded in the LTCC Substrate", 2003 Asia-Pacific Microwave Conference. Nov. 2003, Seoul, Korea, 4 pages.
Todd J. Spencer, "Air-Gap Transmission Lines on Organic Substrates for Low-Loss Interconnects", IEEE Transactions on Microwave Theory and Techniquies, vol. 55, No. 9, Sep. 2007, pp. 1919-1925, IEEE ISSN 0018-9480.
Chung-Hui Chen et al., "A Deep Submicron CMOS Process Compatible Suspending High-Q Inductor", IEEE Electron Device Letters, vol. 22, No. 11, Nov. 2001, pp. 522-523, IEEE ISSN 0741-3106.

\* cited by examiner

ELECTRONIC DEVICE INCLUDING INTERCONNECTS WITH A CAVITY THEREBETWEEN AND A PROCESS OF FORMING THE SAME

BACKGROUND

1. Field of the Disclosure

The present disclosure relates to electronic devices and processes, and more particularly to electronic devices including interconnects and cavities therebetween and processes of forming the same.

2. Description of the Related Art

Parasitic capacitive coupling within an integrated circuit can cause problems with signal loss for on-chip microstrip transmission lines at high frequencies. To reduce capacitive coupling to the ground plane, thicker insulating layers or lower dielectric constant ("k") materials can be used. With a dielectric material such as $SiO_2$, the insulating layer may need to be very thick, particularly for frequencies of at least 30 GHz. Thicker insulating layers cause manufacturing costs and complexity to increase. Much research has been performed on low-k materials. Currently, the most commonly used low-k material used in production is fluorinated silicon dioxide (k~3). The low-k materials can be expensive, have processing constraints, have limited mechanical robustness, or the like.

BRIEF DESCRIPTION OF THE DRAWINGS

Embodiments are illustrated by way of example and are not limited in the accompanying figures.

Figure 1:
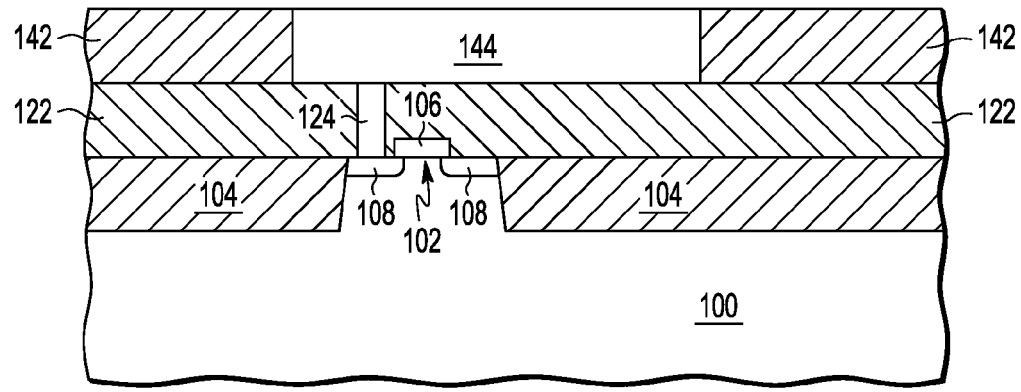
FIG. 1 includes an illustration of a cross-sectional view of a portion of a workpiece after forming insulating layers and an interconnect.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The capacitance between vertically displaced interconnects can be reduced by forming cavities within an insulating layer between the interconnects. The effective dielectric constant of the insulating layer can be reduced without requiring thick insulating layers or exotic low-k dielectric materials. Materials and formation techniques commonly used for integrated circuits can be used, and therefore, development of new materials or unusual process sequences is not required. In a particular application, the concepts described herein can help to reduce signal loss within a high-frequency microstrip transmission line caused by capacitive coupling to an interconnect at a substantially constant voltage, such as a ground plane interconnect, underneath the transmission line or due to another interconnect lying below the transmission line.

Before addressing details of embodiments described below, some terms are defined or clarified. Features within a particular region or area of interest may have dimensions expressed in terms of lengths, widths, and thicknesses (for layers and interconnects) or depths (for openings and cavities). Within the particular region or area of interest, length and width are seen from a top view, and the length is greater than the width. For a square or other similar geometric shape, the dimension from a top view is characterized by a width, and for a circle, the diameter is characterized as a width. For an oval, ellipsoid, or other similar geometric shape, a line segment corresponding to a main axis is characterized as a length, and another line segment corresponding to the minor axis is characterized as a width. The thickness of a layer or the depth of an opening can be seen from a cross-sectional view. The thickness or depth extends in a direction substantially perpendicular to the length and the width.

As used herein, the terms "comprises," "comprising," "includes," "including," "has," "having" or any other variation thereof, are intended to cover a non-exclusive inclusion. Further, unless expressly stated to the contrary, "or" refers to an inclusive or and not to an exclusive or. Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

To the extent not described herein, many details regarding specific materials, processing acts, and circuits are conventional and may be found in textbooks and other sources within the semiconductor and microelectronic arts.

FIG. 1 includes an illustration of a cross-sectional view of a portion of workpiece that includes a substrate 100 having a primary surface 102. The substrate 100 can include a monocrystalline semiconductor wafer, a semiconductor-on-insulator wafer, a flat panel display (e.g., a silicon layer over a glass plate), or other substrate conventionally used to form electronic devices. The primary surface 102 is a surface of the substrate 100 from which electronic components are typically formed. A field isolation region 104 can be formed within portions of substrate 100. FIG. 1 further includes an electronic component, and in the embodiment as illustrated, the electronic component is a transistor. The transistor includes a gate stack 106 and source/drain regions 108. The gate stack 106 includes a gate dielectric layer and a gate electrode. The source/drain regions 108 have a conductivity type opposite of and a higher dopant concentration than the substrate 100. In a particular embodiment, the source/drain regions 108 are heavily doped, for example, a dopant concentration of at least $1 \times 10^{19}$ atoms/cm$^3$. Another electronic component can be used in place of or in addition to the transistor illustrated. The other electronic component can include a different field-effect transistor, a bipolar transistor, a diode, a resistor, a capacitor, or the like.

An insulating layer 122 is formed over the electronic component, the field isolation region 104, and the substrate 100. The insulating layer 122 can include an oxide, a nitride, an oxynitride, or any combination thereof. Further, the insulating layer 122 can include a single film or a plurality of films. For example, the insulating layer 122 can include an etch-stop film, a dielectric film, and an anti-reflective film. In an embodiment, the etch-stop film can include $Si_3N_4$, the dielectric film can include $SiO_2$ (doped or undoped), and the anti-reflective film can include silicon oxynitride. $SiO_2$ has a lower dielectric constant as compared to each of $Si_3N_4$ and silicon oxynitride, and therefore, the dielectric film is significantly thicker than the etch-stop film and the anti-reflective film. In a particular embodiment, the etch-stop film has a thickness in a range of approximately 5 nm to approximately 50 nm, the dielectric film has a thickness in a range of approximately 500 nm to approximately 5000 nm, and the anti-reflective film has a thickness in a range of approximately 5 nm to approximately 50 nm. In another embodiment, each of the films may have a thickness thinner or thicker than those described. In a further embodiment, the insulating layer 122 can include more or fewer films. The number and composition of films within the insulating layer 122 can be tailored to meet the needs or desires for a particular application. The insulating layer 122 may be formed by deposition and may or may not be substantially conformal. The insulating layer 122 can be planarized by using an etch-back or polishing technique. The insulating layer 122 is patterned to define openings, including an opening that exposes one of the source/drain regions 108.

A conductive layer is deposited over the insulating layer 122 and into the openings within the insulating layer 122, and portions of the conductive layer lying outside the openings are removed to form vias, including a via 124. The conductive layer can include polysilicon, a refractory metal (in elemental form or as part of an alloy or a compound), copper, silver, a noble metal (Au, Ru, Rh, Pd, Os, Ir, Pt), another suitable conductive material, or any combination thereof. As used herein, an elemental metal or a metal in elemental form refers to a metal that does not include a significant amount of a corresponding metal compound or alloy. For example, Ti is an elemental metal, whereas TiN is a metal compound, and TiW is a metal alloy. TiN and TiW are not elemental metals. A refractory metal has a melting point of at least 1400° C. at approximately atmospheric pressure. The conductive layer includes a single film or a plurality of films. The conductive layer can be deposited by physical vapor deposition, chemical vapor deposition, plating, or any combination thereof. In an exemplary embodiment, an adhesion film, a barrier film, and a main film can be sequentially deposited. The adhesion film can include an elemental metal, the barrier film can include a metal nitride, and the main film can include an elemental metal different from the elemental metal of the adhesion film. Portions of the conductive layer overlying the insulating layer 122 can be removed by an etch-back or polishing technique to form the vias, including the via 124.

The insulating layer 142 can include any of the materials and number of films, have any of the thicknesses, and be formed using any of the deposition techniques as described with respect to the insulating layer 122. The insulating layers 122 and 142 can have substantially the same composition or different compositions, substantially the same thickness or different thicknesses, and be formed using the same deposition technique or different deposition techniques. The insulating layer 142 is patterned to define openings.

A conductive layer is deposited over the insulating layer 142 and into the openings within the insulating layer 142, and portions of the conductive layer lying outside the openings is removed to form interconnects, including an interconnect 144, which is electrically connected to one of the source/drain regions 108 as illustrated in FIG. 1. The interconnects can be configured to be at a substantially constant voltage or be used to transmit an electronic signal, such data from an address line. In a particular embodiment, the interconnect 144 can be electrically connected to a ground terminal or a $V_{SS}$ terminal.

The conductive layer for the interconnects can include any of the materials and number of films, have any of the thicknesses, and be formed using any of the deposition techniques as described with respect to the conductive layer for the vias. The conductive layers for the interconnects and vias can have substantially the same composition or different compositions, substantially the same thickness or different thicknesses, and be formed using the same deposition technique or different deposition techniques. Portions of the conductive layer overlying the insulating layer 142 can be removed by an etch-back or polishing technique to form the interconnects, including the interconnect 144.

Figure 2:
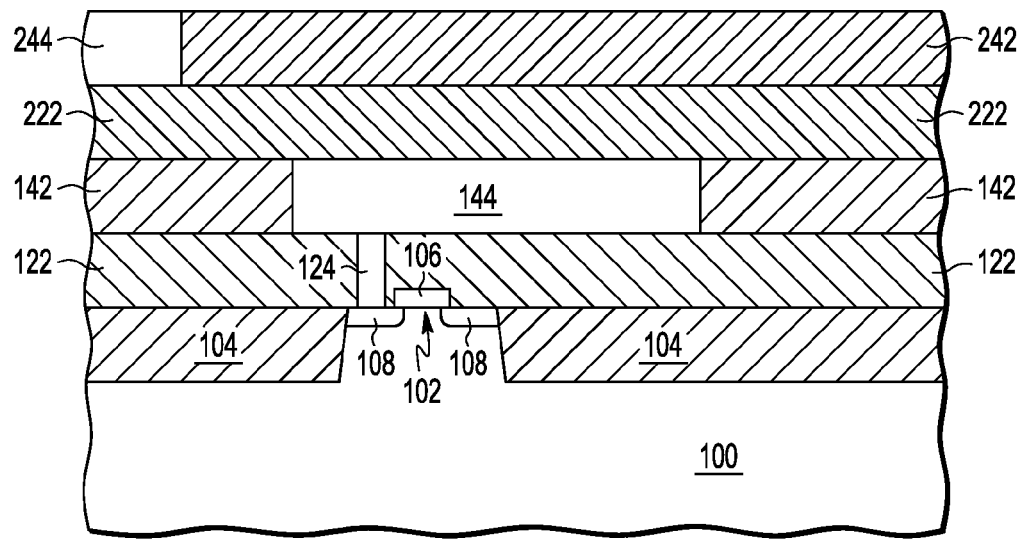
FIG. 2 includes an illustration of a cross-sectional view of the workpiece of FIG. 1 after forming insulating layers and an interconnect.

FIG. 2 includes an illustration of a cross-sectional view after forming another insulating layer 222, vias (not illustrated) extending through the insulating layer 222, another insulating layer 242, and interconnects, including an interconnect 244. The insulating layer 222 can include any of the materials and number of films, have any of the thicknesses, and be formed using any of the deposition techniques as described with respect to the insulating layer 122. The insulating layer 222 can have substantially the same composition or different compositions, substantially the same thickness or different thicknesses, and be formed using the same deposition technique or different deposition techniques as compared to any of the insulating layers 122 and 142. The insulating layer 222 is patterned to define openings.

A conductive layer is deposited over the insulating layer 222 and into the openings within the insulating layer 222, and portions of the conductive layer lying outside the openings is removed to form interconnects, some of which are coupled, or in a particular embodiment, electrically connected, to interconnects that are within openings in the insulating layer 142. The conductive layer for the vias can include any of the materials and number of films, have any of the thickness, and be formed using any of the deposition techniques as described with respect to the conductive layer for the vias within the insulating layer 122. The conductive layers for the vias within the insulating layer 122 and 222 can have substantially the same composition or different compositions, substantially the same thickness or different thicknesses, and be formed using the same deposition technique or different deposition techniques. Portions of the conductive layer overlying the insulating layer 222 can be removed by an etch-back or polishing technique to form the vias The insulating layer 242 can include any of the materials and number of films, have any of the thicknesses, and be formed using any of the deposition techniques as described with respect to the insulating layer 122. The insulating layer 242 can have substantially the same composition or different compositions, substantially the same thickness or different thicknesses, and be formed using the same deposition technique or different deposition techniques as compared to any of the previously-formed insulating layers. The insulating layer 242 is patterned to define openings.

A conductive layer is deposited over the insulating layer 242 and into the openings within the insulating layer 242, and portions of the conductive layer lying outside the openings is removed to form interconnects, including the interconnect 244. The interconnects within the insulating layer 242 can be configured to be at a substantially constant voltage or be used to transmit an electronic signal, such data from an address line. One or more interconnects within the insulating layer 242 can be coupled, or in a particular embodiment, electrically connected, to a previously-formed interconnect; the gate electrode within the gate stack 106; a source/drain region 108; another electronic component at the primary surface 102; or any combination thereof.

The conductive layer for the interconnects within the insulating layer 242 can include any of the materials and number of films, have any of the thicknesses, and be formed using any of the deposition techniques as described with respect to the conductive layer for the vias within the insulating layer 122. The conductive layers for the interconnects within the insulating layer 242 can have substantially the same composition or different compositions, substantially the same thickness or different thicknesses, and be formed using the same deposition technique or different deposition techniques as compared to any of the previously-formed vias and interconnects. Portions of the conductive layer overlying the insulating layer 242 can be removed by an etch-back or polishing technique to form the interconnects, including the interconnect 244.

Figure 3:
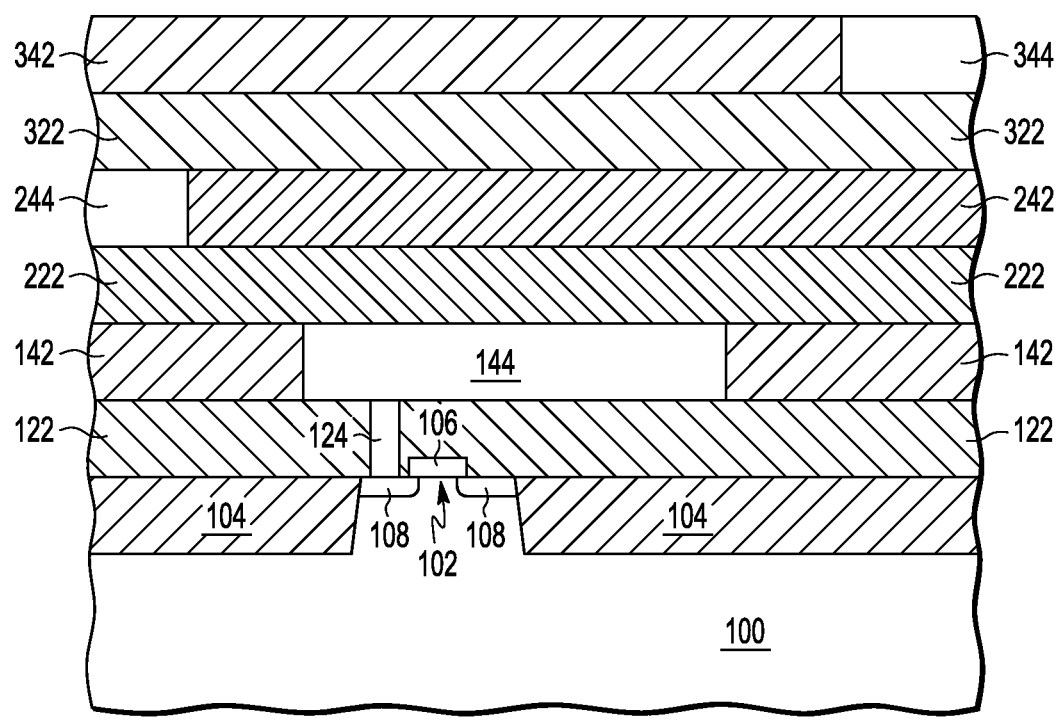
FIG. 3 includes an illustration of a cross-sectional view of the workpiece of FIG. 2 after forming insulating layers and an interconnect.

FIG. 3 includes an illustration of a cross-sectional view after forming another insulating layer 322, vias (not illustrated) extending through the insulating layer 322, another insulating layer 342, and interconnects, including an interconnect 344. The insulating layer 322 can include any of the materials and number of films, have any of the thicknesses, and be formed using any of the deposition techniques as described with respect to the insulating layer 122. The insulating layer 322 can have substantially the same composition or different compositions, substantially the same thickness or different thicknesses, and be formed using the same deposition technique or different deposition techniques as compared to any of the previously-formed insulating layers. The insulating layer 322 is patterned to define openings.

A conductive layer is deposited over the insulating layer 322 and into the openings within the insulating layer 322, and portions of the conductive layer lying outside the openings is removed to form vias, some of which are coupled, or in a particular embodiment, electrically connected, to interconnects that are within openings in the insulating layer 142 or 242. The conductive layer for the vias can include any of the materials and number of films, have any of the thicknesses, and be formed using any of the deposition techniques as described with respect to the conductive layer for the vias within the insulating layer 122. The conductive layer for the vias within the insulating layer 322 can have substantially the same composition or different compositions, substantially the same thickness or different thicknesses, and be formed using the same deposition technique or different deposition techniques as compared to any of the previously-formed vias and interconnects. Portions of the conductive layer overlying the insulating layer 322 can be removed by an etch-back or polishing technique to form the vias.

The insulating layer 342 can include any of the materials and number of films, have any of the thicknesses, and be formed using any of the deposition techniques as described with respect to the insulating layer 122. The insulating layers 122 and 342 can have substantially the same composition or different compositions, substantially the same thickness or different thicknesses, and be formed using the same deposition technique or different deposition techniques as compared to any of the previously-formed insulating layers. The insulating layer 342 is patterned to define openings.

A conductive layer is deposited over the insulating layer 342 and into the openings within the insulating layer 342, and portions of the conductive layer lying outside the openings is removed to form interconnects, including the interconnect 344. The interconnects within the insulating layer 342 can be configured to be at a substantially constant voltage or be used to transmit an electronic signal, such data from an address line. One or more interconnects within the insulating layer 342 can be coupled, or in a particular embodiment, electrically connected, to a previously-formed interconnect; the gate electrode within the gate stack 106; a source/drain region 108; another electronic component at the primary surface 102; or any combination thereof.

The conductive layer for the interconnects within the insulating layer 342 can include any of the materials and number of films, have any of the thickness, and be formed using any of the deposition techniques as described with respect to the conductive layer for the vias within the insulating layer 122. The conductive layers for the interconnects within the insulating layer 342 can have substantially the same composition or different compositions, substantially the same thickness or different thicknesses, and be formed using the same deposition technique or different deposition techniques as compared to any of the previously-formed vias and interconnects. Portions of the conductive layer overlying the insulating layer 342 can be removed by an etch-back or polishing technique to form the interconnects, including the interconnect 344.

Figure 4:
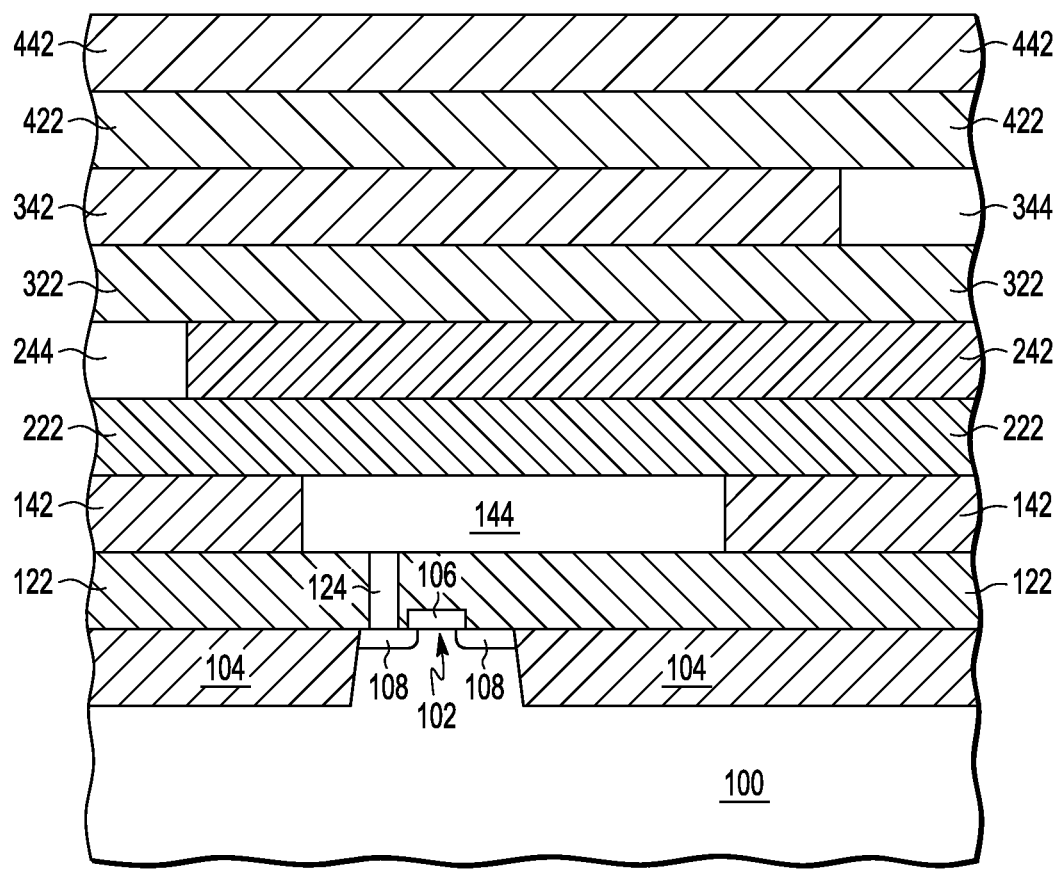
FIG. 4 includes an illustration of a cross-sectional view of the workpiece of FIG. 3 after forming insulating layers.

FIG. 4 includes an illustration of a cross-sectional view after forming another insulating layer 422, vias (not illustrated) extending through the insulating layer 422, another insulating layer 442, and interconnects (not illustrated) extending through the insulating layer 442. The insulating layer 422 can include any of the materials and number of films, have any of the thicknesses, and be formed using any of the deposition techniques as described with respect to the insulating layer 122. The insulating layer 422 can have substantially the same composition or different compositions, substantially the same thickness or different thicknesses, and be formed using the same deposition technique or different deposition techniques as compared to any of the previously-formed insulating layers. The insulating layer 422 is patterned to define openings.

A conductive layer is deposited over the insulating layer 422 and into the openings within the insulating layer 422, and portions of the conductive layer lying outside the openings is removed to form vias, some of which are coupled, or in a particular embodiment, electrically connected, to previously-formed interconnects. The conductive layer for the vias can include any of the materials and number of films, have any of the thicknesses, and be formed using any of the deposition techniques as described with respect to the conductive layer for the vias within the insulating layer 122. The conductive layers for the vias within the insulating layer 422 can have substantially the same composition or different compositions, substantially the same thickness or different thicknesses, and be formed using the same deposition technique or different deposition techniques as compared to any of the previously-formed vias and interconnects. Portions of the conductive layer overlying the insulating layer 422 can be removed by an etch-back or polishing technique to form the vias.

The insulating layer 442 can include any of the materials and number of films, have any of the thicknesses, and be formed using any of the deposition techniques as described with respect to the insulating layer 122. The insulating layer 422 can have substantially the same composition or different compositions, substantially the same thickness or different thicknesses, and be formed using the same deposition technique or different deposition techniques as compared to any of the previously-formed insulating layers. The insulating layer 442 is patterned to define openings.

A conductive layer is deposited over the insulating layer 442 and into the openings within the insulating layer 442, and portions of the conductive layer lying outside the openings is removed to form interconnects. The interconnects within the insulating layer 442 can be configured to be at a substantially constant voltage or be used to transmit an electronic signal, such data from an address line. One or more interconnects within the insulating layer 442 can be coupled, or in a particular embodiment, electrically connected, to a previously-formed interconnect; the gate electrode within the gate stack 106; a source/drain region 108; another electronic component at the primary surface 102; or any combination thereof.

The conductive layer for the interconnects within the insulating layer 442 can include any of the materials and number of films, have any of the thicknesses, and be formed using any of the deposition techniques as described with respect to the conductive layer for the vias within the insulating layer 122. The conductive layers for the interconnects within the insulating layer 442 can have substantially the same composition or different compositions, substantially the same thickness or different thicknesses, and be formed using the same deposition technique or different deposition techniques as compared to any of the previously-formed vias and interconnects. Portions of the conductive layer overlying the insulating layer 442 can be removed by an etch-back or polishing technique to form the interconnects.

Figure 5:
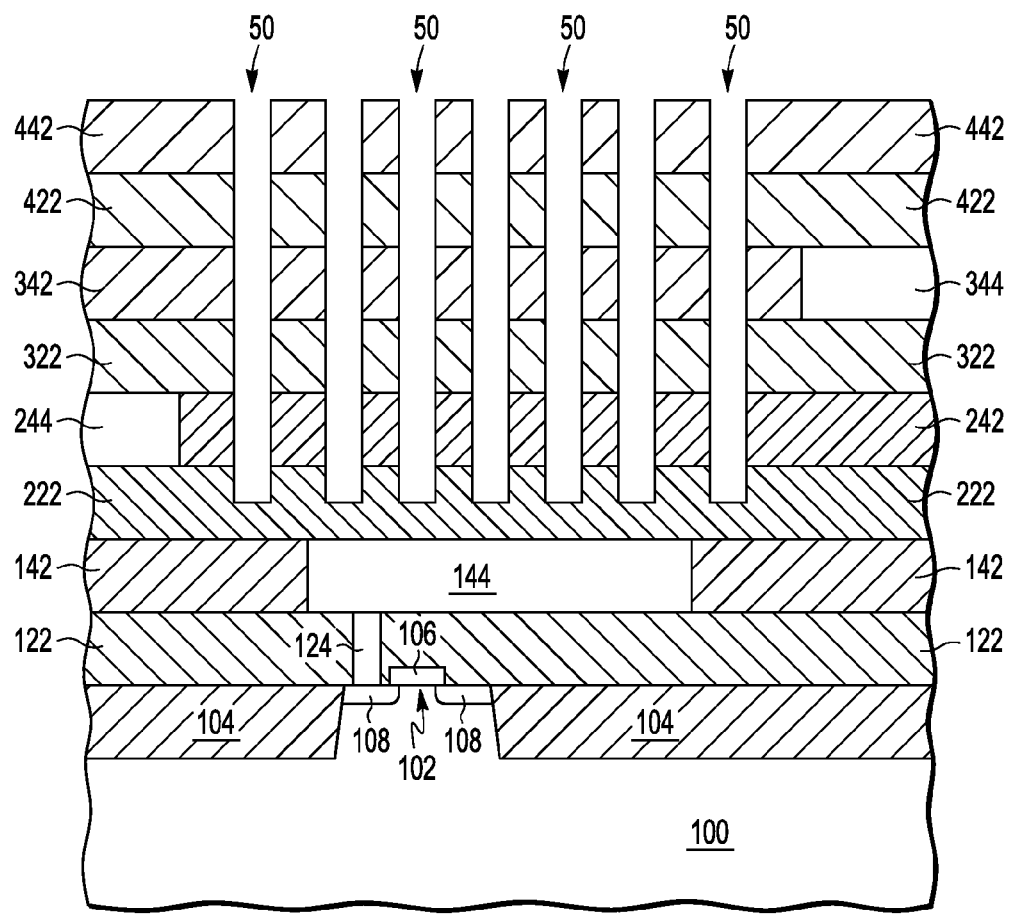
FIG. 5 includes an illustration of a cross-sectional view of the workpiece of FIG. 4 after patterning insulating layers and to define openings within the insulating layers.

FIG. 5 includes an illustration of a cross-sectional view of the workpiece after patterning insulating layers to define openings 50 that extend towards the interconnect 144 and the primary surface 102 of the substrate 100. In the embodiment as illustrated, the openings extend completely through the thickness of the insulating layers 244, 322, 342, 422, and 442, and partially through the insulating layer 222. In another embodiment, the openings 50 may not extend into the insulating layer 222. In a further embodiment, the openings 50 may extend completely through the insulating layer 222 and expose portions of the insulating layer 142 and interconnects, including the interconnect 144, within the insulating layer 142. In the embodiment as illustrated, the openings 50 are spaced part from the interconnects within the insulating layers 242, 342, and 442. Such interconnects include the interconnects 244 and 344. The layout of the openings 50, as seen from a top view, is addressed later in this specification.

In an embodiment, the depths of the openings 50 can be at least approximately 1 micron, and in another embodiment, the depths of the openings 50 can be at least approximately 2 microns. In a further embodiment, the depths of the openings 50 may be no greater than approximately 9 microns, and in still a further embodiment, the depths of the openings 50 may be no greater than approximately 5 microns.

In an embodiment, the widths of the openings 50 can be at least approximately 0.1 micron, and in another embodiment, the widths of the openings 50 can be at least approximately 0.2 microns. In a further embodiment, the widths of the openings 50 may be no greater than approximately 0.9 microns, and in still a further embodiment, the widths of the openings 50 may be no greater than approximately 0.7 microns. In a particular embodiment, the openings 50 have widths in a range of approximately 0.25 microns to approximately 0.5 microns. The widths as described above can be measured near the top of the openings 50. The widths along the bottom of the openings 50 can be the same or may be slightly less. Accordingly, wall of the insulating layers at the openings 50 can have substantially vertical walls (illustrated) or be slightly tapered (not illustrated). As used hereinafter, the dimensions of the widths of the openings will be with respect to near the top of the openings, as opposed to at the bottom of the openings, unless explicitly stated to the contrary.

As used herein, the aspect ratio of an opening is the ratio of the height of the opening to the width of the opening In an embodiment, the aspect ratios of the openings 50 can be at least approximately 2, and in another embodiment, the aspect ratios of the openings 50 can be at least approximately 3. In a further embodiment, the aspect ratios of the openings 50 may be no greater than approximately 20, and in still a further embodiment, the aspect ratios of the openings 50 may be no greater than approximately 15. In a particular embodiment, the openings 50 have aspect ratios in a range of approximately 4 to approximately 10.

As used herein, a space is a minimum distance between any two immediately adjacent openings 50 within a set of openings. In an embodiment, the spaces between the openings 50 can be at least approximately 1.0 times with widths of the openings 50, and in another embodiment, the spaces of the openings 50 can be at least approximately 1.2 times the widths of the openings. In a further embodiment, the spaces between the openings 50 may be no greater than approximately 2.0 times the widths of the openings 50, and in still a further embodiment, the spaces between the openings 50 may be no greater than approximately 1.8 times the widths of the openings 50.

The insulating layers can be patterned to openings 50 by using a mask (not illustrated) and an anisotropic dry etching technique. The mask can include an organic resist material. The etch can be performed using reactive ion etching. The etching chemistry can include a halogen-containing gas, such as $CF_4$, $CF_3H$, $HCl$, $Cl_2$, $HBr$, $Br_2$, $SF_6$, another suitable etchant, or any combination thereof. In an embodiment, the etching chemistry includes a hydrogen-containing gas, and in another embodiment, the etching chemistry may be substantially free of oxygen (for example, $O_2$, $O_3$, CO, another oxygen-containing gas, or any combination thereof). The hydrogen-containing gas can help to keep the etching more anisotropic by forming a polymer along the walls of the openings 50. The absence of oxygen may help to reduce erosion of the mask when forming the openings 50. If needed or desired, the organic resist material can be thickened or a plurality of organic resist films can formed and patterned before etching the insulating layers. After patterning the insulating layers to define the openings 50, the mask is removed.

Figure 6:
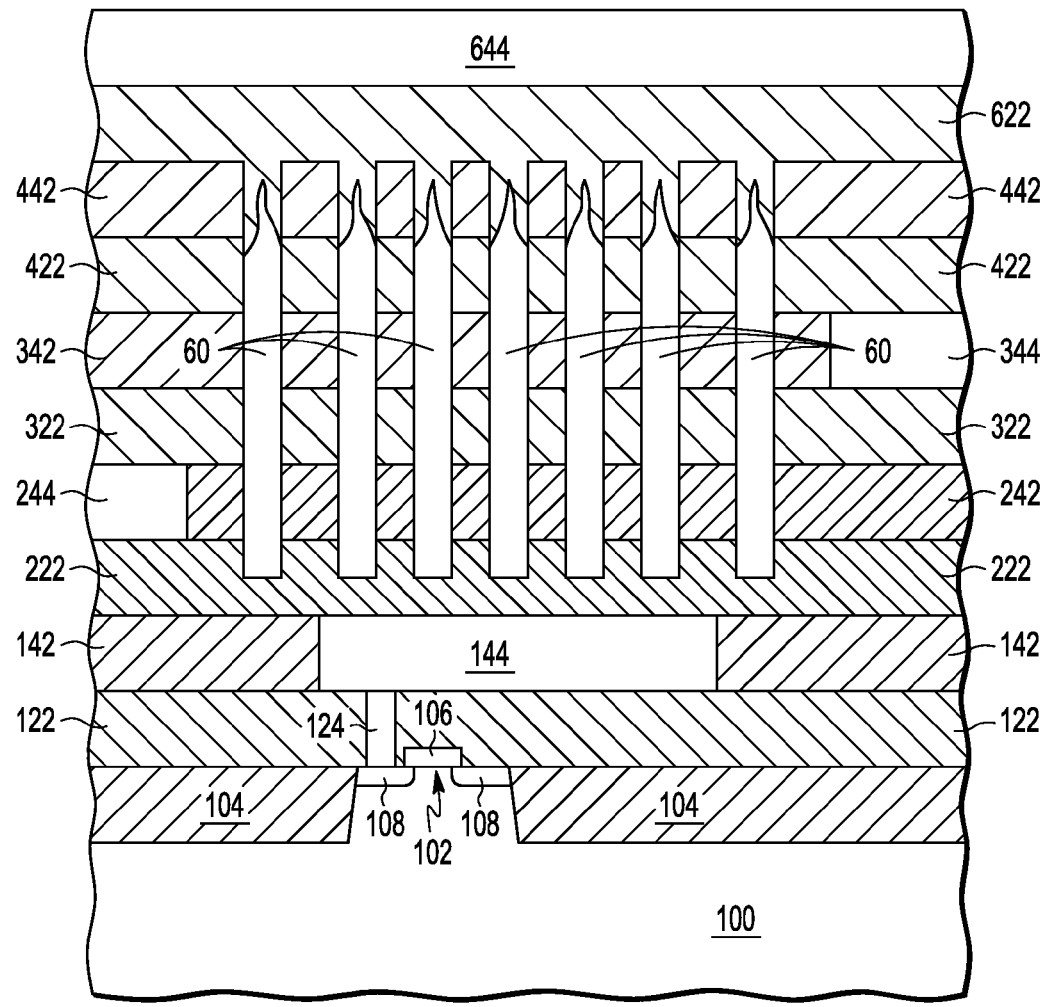
FIG. 6 includes an illustration of a cross-sectional view of the workpiece of FIG. 5 after forming an insulating layer that seals the openings to form cavities.

FIG. 6 includes an illustration of a cross-sectional view after forming another insulating layer 622, vias (not illustrated) extending through the insulating layer 622, another insulating layer (not illustrate), and interconnects, including an interconnect 644, extending through the insulating layer. The insulating layer 622 can include any of the materials and number of films and have any of the thicknesses as described with respect to the insulating layer 122. The insulating layer 622 can have substantially the same composition or different compositions and substantially the same thickness or different thicknesses as compared to any of the previously-formed insulating layers.

The insulating layer 622 is formed using a non-conformal deposition technique to seal the openings to form cavities 60. The insulating layer 622 can be formed from tetraorthosilicate ("TEOS"), fluorine-doped TEOS, SiCOH, another suitable oxide having a dielectric constant no greater than approximately 4, or any combination thereof. As the deposition is made more non-conformal, the volume of the cavities increases as less of the insulating layer 622 may be deposited along the sides and bottoms of the openings before the openings are sealed to form the cavities 60. A more non-conformal deposition may be achieved by using a relatively higher deposition rate, a relatively lower deposition temperature, a plasma during deposition, or any combination thereof. As the volume of the cavities 60 increase, the effective dielectric constant between the interconnects 144 and 644 decreases. In another embodiment, conventional deposition materials and conditions may be used. After the insulating layer 622 is sufficiently thick, the insulating layer 622 can be planarized by using an etch-back or polishing technique. The insulating layer 622 is patterned to define openings (not illustrated).

A conductive layer is deposited over the insulating layer 622 and into the openings within the insulating layer 622, and portions of the conductive layer lying outside the openings is removed to form vias, some of which are coupled, or in a particular embodiment, electrically connected, to the previously-formed interconnects. The conductive layer for the vias can include any of the materials and number of films, have any of the thicknesses, and be formed using any of the deposition techniques as described with respect to the conductive layer for the vias within the insulating layer 122. The conductive layers for the vias within the insulating layer 622 can have substantially the same composition or different compositions, substantially the same thickness or different thicknesses, and be formed using the same deposition technique or different deposition techniques as compared to any of the previously-formed vias and interconnects. Portions of the conductive layer overlying the insulating layer 622 can be removed by an etch-back or polishing technique to form the vias. The vias formed in the insulating layer 622 are spaced apart from regions where the cavities 50 or 60 are formed.

The insulating layer (not illustrated in FIG. 6) over the insulating layer 622 can include any of the materials and number of films, have any of the thicknesses, and be formed using any of the deposition techniques as described with respect to the insulating layer 122. The insulating layer can have substantially the same composition or different compositions, substantially the same thickness or different thicknesses, and be formed using the same deposition technique or different deposition techniques as compared to any of the previously-formed insulation layers. The insulating layer 642 is patterned to define openings.

A conductive layer is deposited over the insulating layer and into the openings within the insulating layer, and portions of the conductive layer lying outside the openings is removed to form interconnects, including the interconnect 644. The interconnects, including the interconnect 644, can be configured to be at a substantially constant voltage or be used to transmit an electronic signal, such data from an address line. One or more interconnects can be coupled, or in a particular embodiment, electrically connected, to a previously-formed interconnect; the gate electrode within the gate stack 106; a source/drain region 108; another electronic component at the primary surface 102; or any combination thereof. In a particular embodiment, the interconnect 644 can be configured to transmit a signal for a high-frequency application. For example, the interconnect 644 can be configured to transmit data within a carrier wave having a frequency of at least approximately 30 GHz. In another embodiment, the carrier wave can have a frequency of at least approximately 70 GHz, and in a further embodiment, the carrier wave can have a frequency of at least approximately 90 GHz.

The conductive layer for the interconnects, including the interconnect 644, can include any of the materials and number of films, have any of the thicknesses, and be formed using any of the deposition techniques as described with respect to the conductive layer for the vias within the insulating layer 122. The conductive layers for the interconnects within the insulating layer 642 can have substantially the same composition or different compositions, substantially the same thickness or different thicknesses, and be formed using the same deposition technique or different deposition techniques as compared to any of the previously-formed vias and interconnects. Portions of the conductive layer overlying the insulating layer 642 can be removed by an etch-back or polishing technique to form the interconnects. The thickness of the conductive layer can be thicker than the skin depth for improved performance. The skin depth is a function of the frequency of the signal on the interconnect 644 and the metal conductivity (depends on the material used for the conductor). In another embodiment (not illustrated), the interconnect 144 may be significantly larger, and thus, substantially all of the interconnect 644 may overlie the interconnect 144.

Figure 7:
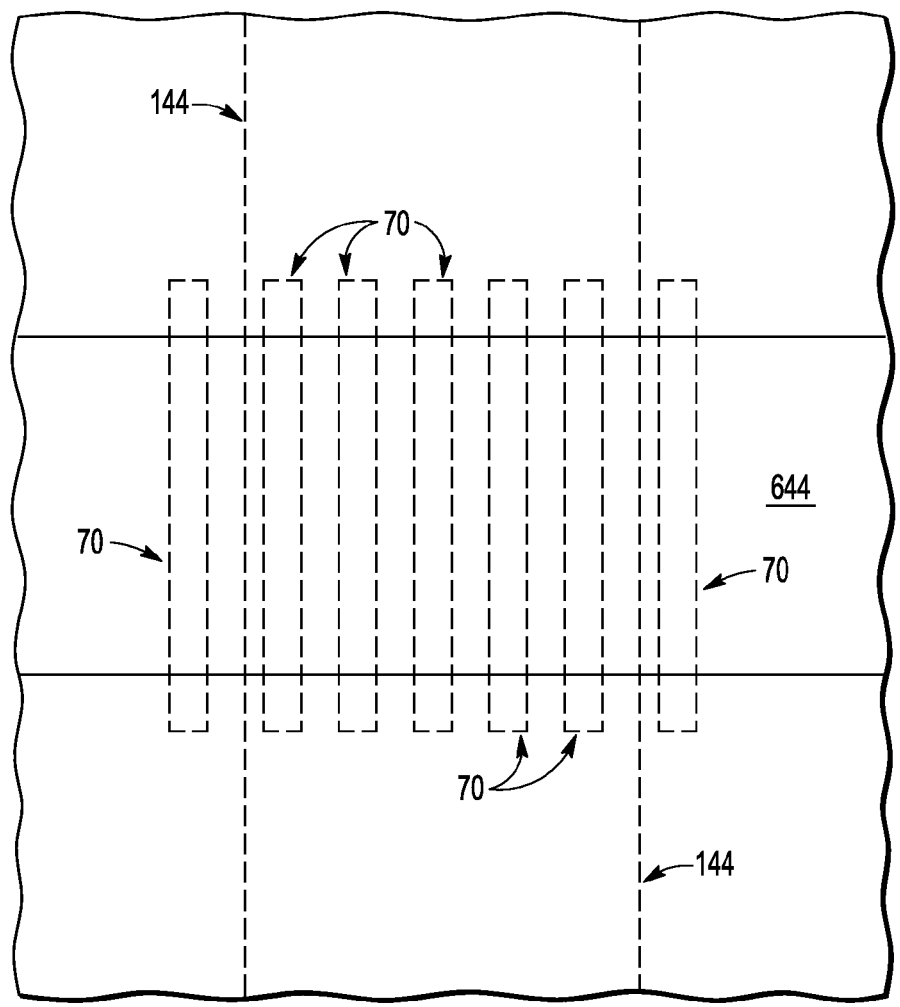
FIG. 7 includes an illustration of a top view of the workpiece of FIG. 6 depicting a layout of interconnects and cavities in accordance with an embodiment.
Figure 8:
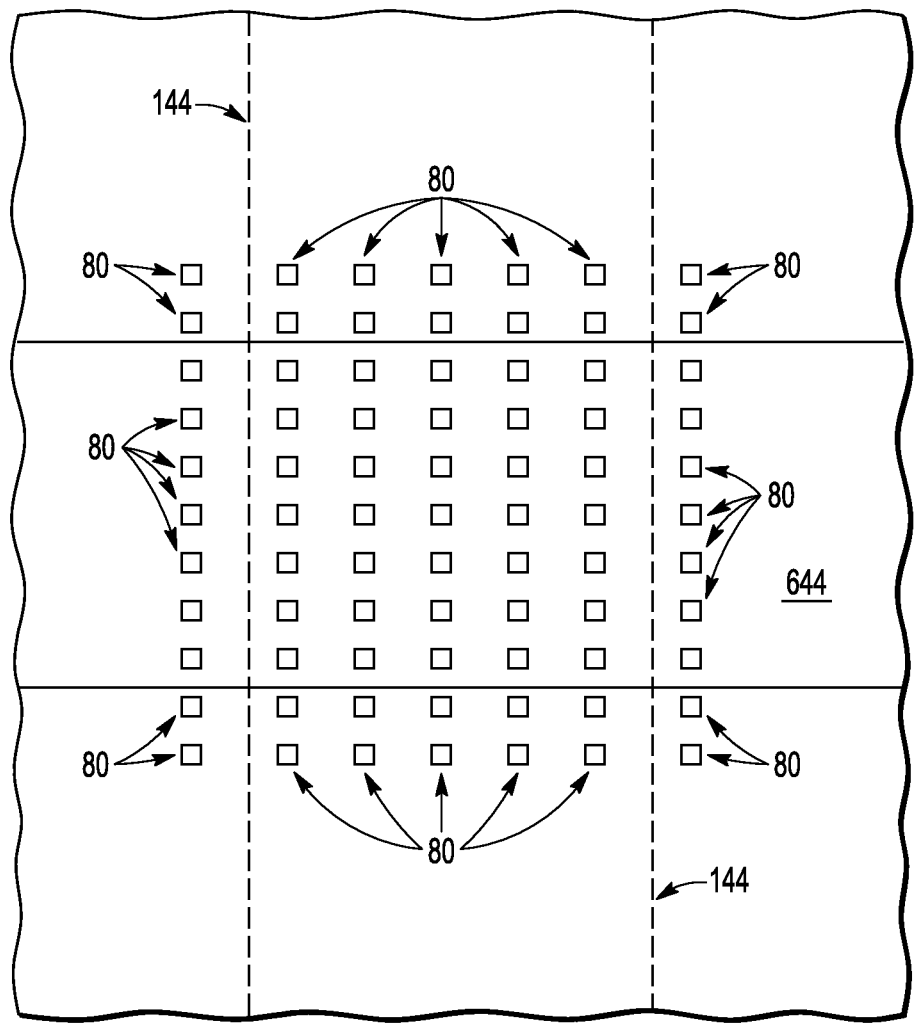
FIG. 8 includes an illustration of a top view of the workpiece of FIG. 6 depicting a layout of interconnects and cavities in accordance with another embodiment.

FIGS. 7 and 8 include depictions of top views of the workpiece at this point in the process to illustrate positional relationships between patterns of cavities and the interconnects 144 and 644. The position and size relationships of the cavities also apply to the corresponding openings from which the cavities are formed. Because the interconnect 144 and cavities are not exposed along the uppermost surface, they are illustrated with dashed lines. Referring to FIG. 7, the cavities 70 are in the form of trenches, wherein the lengths of the trenches are significantly greater than the widths of the trenches. The lengths of the cavities 70 can be longer than the interconnect 144, the interconnect 644, or both. Referring to FIG. 8, the cavities 80 are in the form of squares. In another embodiment, the cavities can have shapes from a top view that include triangles, rectangles or other quadrilaterals, hexagons, octagons, other polygons, circles, ovals, ellipsoids, other suitable shapes with curved edges, or combinations thereof. The widths of the cavities 70 and 80 can be less than the width of the interconnect 144, the interconnect 644, or both. The cavities 70 and 80 can be organized into an array of rows, columns, or rows and columns.

The cavities 70 or pattern of cavities 80 can extend beyond the edges of either or both interconnects 144 and 644. In an embodiment, the interconnect 144 is electrically connected to a ground or $V_{SS}$ terminal, and the interconnect 644 is configured for high-frequency data transmission. In an embodiment, the extension of the cavities beyond the edges of the interconnect 144, interconnect 644, or both can be at least approximately 1.1 times the thickness of the interconnect 644, and in yet another embodiment, the extension of the cavities can be at least approximately 1.2 times the thickness of the interconnect 644. In a further embodiment, the extension of the cavities may be no greater than approximately 2.0 times the thickness of the interconnect 644, and in still a further embodiment, the extension of the cavities may be no greater than 1.9 times the thickness of the interconnect 644. In a particular embodiment, the extensions of the cavities are in a range of approximately 1.2 to approximately 1.5 times the thickness of the interconnect 644. The significance of the cavities and effective dielectric constant will be discussed later in this specification.

Figure 9:
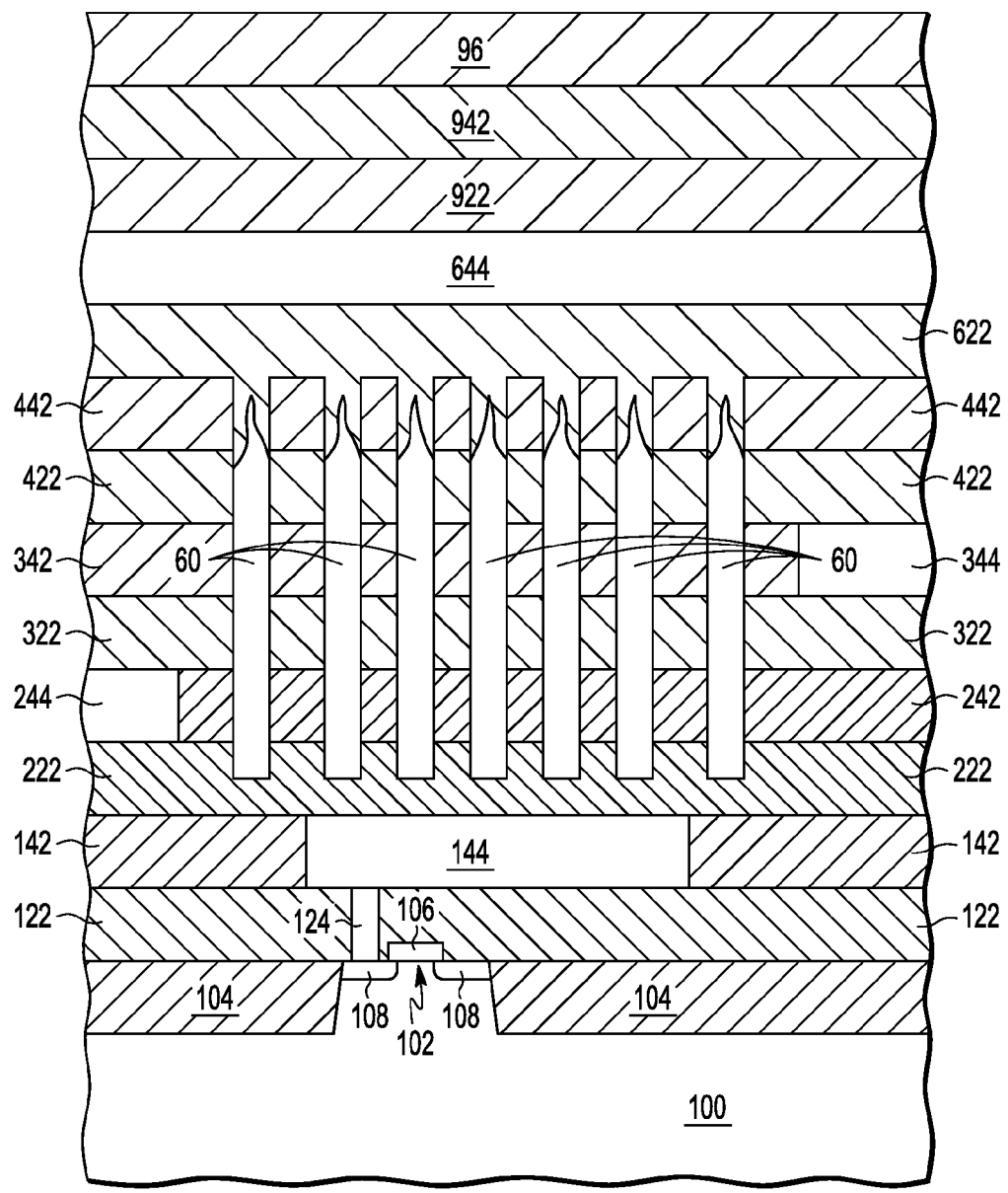
FIG. 9 includes an illustration of a cross-sectional view of the workpiece of FIG. 6 after forming a substantially completed device.

FIG. 9 includes an illustration of a substantially completed electronic device, including an insulating layer 922, vias (not illustrated) extending through the insulating layer 922, an insulating layer 942, and interconnects (not illustrated) extending through the insulating layer 942. The insulating layer 922 can include any of the materials and number of films, have any of the thicknesses, and be formed using any of the deposition techniques as described with respect to the insulating layer 122. The insulating layer 922 can have substantially the same composition or different compositions, substantially the same thickness or different thicknesses, and be formed using the same deposition technique or different deposition techniques as compared to any of the previously-formed insulating layers. The insulating layer 922 is patterned to define openings.

A conductive layer is deposited over the insulating layer 922 and into the openings within the insulating layer 922, and portions of the conductive layer lying outside the openings are removed to form vias, some of which are coupled, or in a particular embodiment, electrically connected, to interconnects lying at elevations closer to the primary surface 102 of the substrate 100. The conductive layer for the vias can include any of the materials and number of films, have any of the thicknesses, and be formed using any of the deposition techniques as described with respect to the conductive layer for the vias within the insulating layer 122. The conductive layer for the vias within the insulating layer 922 can have substantially the same composition or different compositions, substantially the same thickness or different thicknesses, and be formed using the same deposition technique or different deposition techniques as compared to any of the previously-formed vias and interconnects. Portions of the conductive layer overlying the insulating layer 922 can be removed by an etch-back or polishing technique to form the vias.

The insulating layer 942 can include any of the materials and number of films, have any of the thicknesses, and be formed using any of the deposition techniques as described with respect to the insulating layer 122. The insulating layer 942 can have substantially the same composition or different compositions, substantially the same thickness or different thicknesses, and be formed using the same deposition technique or different deposition techniques as compared to any of the previously-formed insulating layers. The insulating layer 942 is patterned to define openings.

A conductive layer is deposited over the insulating layer 942 and into the openings within the insulating layer 942, and portions of the conductive layer lying outside the openings are removed to form interconnects. The interconnects within the insulating layer 942 can be configured to be at a substantially constant voltage or be used to transmit an electronic signal, such data from an address line. One or more interconnects within the insulating layer 942 can be coupled, or in a particular embodiment, electrically connected, to a previously-formed interconnect; the gate electrode within the gate stack 106; a source/drain region 108; another electronic component at the primary surface 102; or any combination thereof.

The conductive layer for the interconnects within the insulating layer 942 can include any of the materials and number of films, have any of the thickness, and be formed using any of the deposition techniques as described with respect to the conductive layer for the vias within the insulating layer 122. The conductive layers for the interconnects within the insulating layer 942 can have substantially the same composition or different compositions, substantially the same thickness or different thicknesses, and be formed using the same deposition technique or different deposition techniques as compared to any of the previously-formed vias and interconnects. Portions of the conductive layer overlying the insulating layer 942 can be removed by an etch-back or polishing technique to form the interconnects. The interconnects within the insulating layer 942 can include bond pads. In a non-limiting embodiment, all the vias can principally include tungsten, and all the interconnects can principally include copper.

A passivation layer 96 is formed over the insulating layer 942. The passivation layer 96 can include any of the materials and number of films, have any of the thicknesses, and be formed using any of the deposition techniques as described with respect to the insulating layer 122. The passivation layer 96 can have substantially the same composition or different compositions, substantially the same thickness or different thicknesses, and be formed using the same deposition technique or different deposition techniques as compared to any of the previously-formed insulating layers. In a particular embodiment, the passivation layer 96 has a higher nitrogen content to improve its hydrogen and water barrier properties. The passivation layer 96 is patterned to define openings. Wires (not illustrated) can be attached to the bond pads or bumps (not illustrated) can be formed over the bond pads.

Some aspects of the embodiments described herein are addressed to give a better appreciation of the significance of the designs. When the interconnect 144 is at approximately ground or $V_{SS}$ and the interconnect 644 includes a high-frequency transmission line, the interconnect 144 can interfere with high-frequency data transmission along interconnect 644 potentially resulting in signal loss if the capacitance between the interconnects 144 and 644 is too high. By forming the cavities, the effective dielectric constant for the dielectric material between the interconnects is reduced. For example, the effective dielectric constant can be approximately 2.5 when the width of the openings is substantially the same as the spaces between the openings, the resulting cavities are formed from long trenches (see cavities 70 in FIG. 7), and most of the thickness of the layers between the interconnects is $SiO_2$ (k=3.9). In another example, the effective dielectric constant is approximately 3.2 when the width of the openings is substantially the same as the spaces between the openings, the resulting cavities are formed from square openings (see cavities 80 in FIG. 8), and most of the thickness of the layers between the interconnects is $SiO_2$. Thus, the concepts described herein can be used to achieve as low as or lower than state-of-the-art low-k (k~3) dielectric materials while still using conventional dielectric materials and formation techniques. Clearly, issues with low-k dielectric materials can be obviated. Performance of 76-81 GHz automotive radar products can be improved, and potential 94-120 GHz imaging applications may be realized.

To the inventors' knowledge, cavities have not been used in a vertical arrangement of interconnects to decrease capacitance between such interconnects that are not electrically connected to each other. Conventionally, cavities are used for interconnects within the same interconnect level, as opposed to interconnects within different interconnect levels.

Note that the concepts herein can still be used with state-of-the-art low-k dielectric materials. When the dielectric constant of such materials is 3, the effective dielectric constants may be approximately 2 and 2.5 when the cavities have shapes from top views that are similar to cavities 70 and 80, respectively.

In embodiments described above, single-inlaid vias and interconnects are formed. In other embodiments, dual-inlaid interconnects can be formed that include a via portion extending to an underlying interconnect.

The processing to form the cavities can be performed without needing to develop new materials or complicated processing sequences. The size of the openings used to form the cavities can be significantly larger than the design rules. Thus, the patterning of the mask from which the openings are formed can be performed using a non-critical alignment, and process margin during patterning of the mask is good. The aspect ratios of the openings formed are within the range typically seen for many commercial trench formation processes. Accordingly, the process integration can be relatively straightforward.

As previously described, the sets of cavities 70 and 80 as illustrated in FIGS. 7 and 8 extend beyond the edges of the interconnect 644. When the sets of cavities extend beyond the edges of the interconnect 644, the electric field fringing effects due to electric field lines from extending from conductor 644 and terminating on conductor 144, can be reduced.

Another alternative embodiment can have the interconnects at different elevations. For example, the lower interconnect similar to interconnect 144 can be at an interconnect level that is closest or the penultimate closest to the primary surface 102 of the substrate 100, and the upper interconnect similar to interconnect 644 can be at an interconnect level that is farthest or the penultimate farthest from the primary surface 102 of the substrate 100.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device can include providing a first interconnect over a substrate having a primary surface and depositing a first insulating layer over the first interconnect. The process can also include patterning the first insulating layer to define a first opening extending towards the first interconnect and depositing a second insulating layer over the first insulating layer to seal the first opening and form a first cavity within the first opening. The process can further include forming a second interconnect over the first and second insulating layers. Along a direction substantially perpendicular to the primary surface, the first cavity can be disposed between the first interconnect and the second interconnect.

In an embodiment of the first aspect, the first interconnect is part of an interconnect level that is closest or penultimate closest to the primary surface, and the second interconnect is part of an interconnect level that is farthest or penultimate farthest from the primary surface. In another embodiment, the first interconnect is configured to be at a substantially constant voltage, and the second interconnect is configured to transmit a carrier wave at a frequency of at least approximately 30 GHz. In a particular embodiment, the frequency is at least approximately 70 GHz. In still another embodiment, depositing the first insulating layer includes depositing films having different compositions. In yet another embodiment, patterning the first insulating layer is performed such that the first interconnect is exposed along a bottom of the opening.

In a further embodiment, the first interconnect has a first width, the second interconnect has a second width, and the first opening has a first length that is greater than the first width or the second width. In a particular embodiment, patterning the first insulating layer also defines other openings, wherein each of the other openings has another length that is greater than the first width or the second width. In a more particular embodiment, patterning the first layer is performed such that the first opening and the other openings are arranged in a predetermined pattern.

In another embodiment of the first aspect, patterning the first insulating layer also defines other openings, wherein each of the first opening and the other openings have a width and a length that is smaller than each of the first width and the second width. In a particular embodiment, depositing a second insulating layer also seals the other openings and forms other cavities within the first opening, wherein some of the other cavities directly overlie the first interconnect but do not directly underlie the second interconnect, or some of the other cavities directly underlie the second interconnect but do not overlie the first interconnect. In another particular embodiment, the patterning the first layer is performed such that the first opening and the other openings are arranged in an array of rows or columns.

In a further embodiment of the first aspect, depositing the second insulating layer includes depositing the second insulating layer non-conformally. In a particular embodiment, the process further includes planarizing the second insulating layer before forming the second interconnect. In still a further embodiment, the process further includes depositing an intermediate insulating layer after depositing the first insulating layer, and patterning the intermediate insulating layer before depositing the second insulating layer. The first opening can extend through the intermediate insulating layer, and the cavity extends into the intermediate insulating layer. In a particular embodiment, the process further includes forming an intermediate via or intermediate interconnect that is inlaid within the intermediate insulating layer and spaced apart from the opening.

In a second aspect, an electronic device can include a substrate having a primary surface, a first interconnect at a first elevation above the primary surface, a first insulating layer over the first interconnect, wherein the first insulating layer defines a first cavity, and a second interconnect at a second elevation above the primary surface, wherein the second elevation is different from the first elevation, along a direction substantially perpendicular to the primary surface, the first cavity can be disposed between the first interconnect and the second interconnect, and a via may not be exposed within the first cavity.

In an embodiment of the second aspect, the first insulating layer defines a plurality of cavities, including the first cavity and other cavities, disposed between the first interconnect and the second interconnect. In a particular embodiment, the first interconnect lies within a first interconnect level, and the second interconnect lies within a second interconnect level. The electronic device can further include an intermediate interconnect level having an interconnect that is spaced apart from the first interconnect, the second interconnect, and the first and other cavities. In another embodiment, the first interconnect is configured to operate at a substantially constant voltage, and the second interconnect is configured to transmit a carrier wave at a frequency of at least approximately 30 GHz.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features that are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device comprising:
   providing a first interconnect over a substrate having a primary surface;
   depositing a first insulating layer over the first interconnect;
   depositing an second insulating layer over the first interconnect layer;
   forming a second interconnect that is inlaid within the second insulating layer;
   patterning the first insulating layer and the second insulating layer to define a plurality of openings extending through the first and second insulating layers towards the first interconnect, the plurality of openings spaced vertically apart from the first interconnect, the second interconnect spaced horizontally apart from the plurality of openings;
   depositing a third insulating layer over the first insulating layer and the second insulating layer to seal the plurality of openings and form a pattern of cavities within the plurality of openings, the pattern of cavities including more than one vertically extending cavities; and
   forming a third interconnect over the first, second, and third insulating layers,
   wherein, along a direction substantially perpendicular to the primary surface, the pattern of cavities is disposed between the first interconnect and the third interconnect, the pattern of cavities extending beyond a width of the first interconnect, the second interconnect, or both.

2. The process of claim 1, wherein:
   the first interconnect is part of an interconnect level that is closest or penultimate closest to the primary surface; and
   the third interconnect is part of an interconnect level that is farthest or penultimate farthest from the primary surface.

3. The process of claim 1, wherein:
   the first interconnect is configured to be at a substantially constant voltage; and
   the third interconnect is configured to transmit a carrier wave at a frequency of at least approximately 30 GHz.

4. The process of claim 1, wherein:
   the first interconnect is configured to be at a substantially ground or VSS; and
   the third interconnect is configured to transmit a carrier wave at a frequency of at least approximately 70 GHz.

5. The process of claim 1, wherein depositing the first insulating layer comprises depositing films having different compositions.

6. The process of claim 1, wherein:
   the first interconnect has a first width;
   the third interconnect has a second width; and
   a cavity of the pattern of cavities has a first length that is greater than the first width or the second width.

7. The process of claim 6, wherein each of the other cavities of the pattern of cavities has another length that is greater than the first width or the second width.

8. The process of claim 7, wherein patterning the first insulating layer is performed such that the cavity and the other cavities have aspect ratios in a range of approximately 2 to approximately 20, wherein the aspect ratio of each cavity is a ratio of a height to a width of the each cavity.

9. The process of claim 1, wherein each of the cavity and the other cavities have a width and a length that is smaller than each of the first width and the second width.

10. The process of claim 9, wherein:
    some of the other cavities directly overlie the first interconnect but do not directly underlie the third interconnect; or
    some of the other cavities directly underlie the third interconnect but do not overlie the first interconnect.

11. The process of claim 9, wherein the patterning the first insulating layer and the second insulating layer is performed such that the plurality of openings are arranged in an array of rows or columns.

12. The process of claim 1, wherein depositing the third insulating layer comprises depositing the third insulating layer non-conformally.

13. The process of claim 12, further comprising planarizing the third insulating layer before forming the third interconnect.

14. The process of claim 1, wherein the first and third interconnects each extend within separate parallel planes and in directions within their respective planes opposite one another.

15. The process of claim 1, wherein a ratio of the extension of the pattern of cavities to the thickness of the second interconnect is at least 1.1 and not greater than 2.0.

16. The process of claim 15, wherein the ratio is at least 1.2.

17. The process of claim 1, wherein patterning the first insulating layer to define the plurality of openings includes masking and etching through more than one insulating layer including the first insulating layer and the second insulating layer.

* * * * *